US009318198B2

(12) United States Patent  
Jung et al.

(10) Patent No.: US 9,318,198 B2
(45) Date of Patent: Apr. 19, 2016

(54) MEMORY SYSTEM AND METHOD OF OPERATING THE SAME

(75) Inventors: Min Joong Jung, Gyeonggi-do (KR); Jung Mi Shin, legal representative, Gyeonggi-do (KR); Wan Seob Lee, Gangwon-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 274 days.

(21) Appl. No.: 13/280,860

(22) Filed: Oct. 25, 2011

(65) Prior Publication Data
US 2012/0151161 A1    Jun. 14, 2012

(30) Foreign Application Priority Data

Oct. 26, 2010 (KR) .................. 10-2010-0104857

(51) Int. Cl.
*G06F 13/00* (2006.01)
*G06F 13/28* (2006.01)
*G11C 16/04* (2006.01)
*G11C 29/00* (2006.01)

(52) U.S. Cl.
CPC ............ *G11C 16/0483* (2013.01); *G11C 29/82* (2013.01)

(58) Field of Classification Search
CPC .................................................. G06F 12/0607
See application file for complete search history.

(56) References Cited

U.S. PATENT DOCUMENTS

| 8,174,894 | B2* | 5/2012 | Kim ..................... 365/185.19 |
| 2008/0098192 | A1* | 4/2008 | Im et al. .................... 711/170 |
| 2008/0263262 | A1* | 10/2008 | Sokolov et al. ............. 711/100 |
| 2009/0193058 | A1* | 7/2009 | Reid ........................... 707/200 |

FOREIGN PATENT DOCUMENTS

KR   1020090095842   9/2009

OTHER PUBLICATIONS

Hong Beom Pyeon, Jin-Ki Kim, Hakjune Oh, Apparatus and method for using a page buffer of a memory device as a temporary cache, WO2008101316, Aug. 28, 2008.*
Notice of Preliminary Rejection issued from the Korean Intellectual Property Office on Dec. 26, 2011.

* cited by examiner

*Primary Examiner* — Eric S Cardwell
(74) *Attorney, Agent, or Firm* — IP & T Group LLP

(57) ABSTRACT

A method of operating a memory system according to an aspect of the present disclosure includes storing first data in a memory controller; storing second data in the memory controller, wherein the second data is read from a selected page of a first memory block of a memory device; and performing a program operation for storing third data, that include the first data and the second data, in a selected page of a second memory block of the memory device.

11 Claims, 5 Drawing Sheets

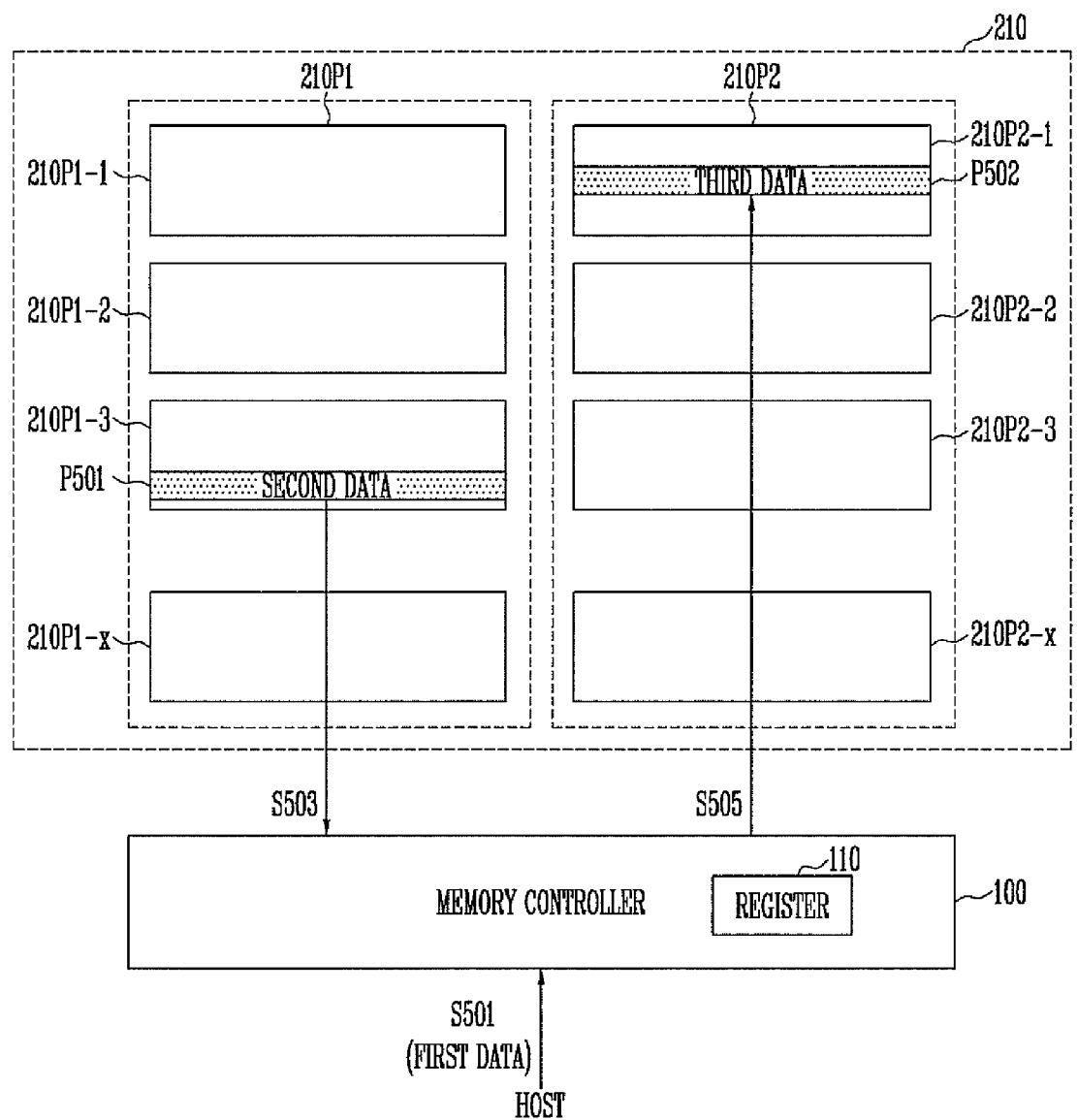

MEMORY SYSTEM AND METHOD OF OPERATING THE SAME

CROSS-REFERENCE TO RELATED APPLICATION

Priority to Korean patent application number 10-2010-0104857 filed on Oct. 26, 2010, the entire disclosure of which is incorporated by reference herein, is claimed.

BACKGROUND

Exemplary embodiments relate to a memory system for inputting and outputting data and a method of operating the same.

A memory system includes a plurality of memory devices. The memory system performs a copyback operation in order to move data, stored in a bad/defective memory device, to a normal memory device or move data, stored in one memory device, to the other memory device at the request of a user.

When data is received from the outside (for example, a host), the external data, together with data stored in a memory device selected in a copyback program operation, is to be stored in another memory device.

BRIEF SUMMARY

Exemplary embodiments relate to a memory system and a method of operating the same, which are capable of efficiently performing a copyback operation for storing external data and data, stored in a memory device, in another memory device.

A method of operating a memory system according to an aspect of the present disclosure includes storing first data, received from an outside of the memory system, in a memory controller; storing second data in the memory controller, wherein the second data is read from a selected page of a first memory block of a memory device; and performing a program operation for storing third data, that include the first data and the second data, in a selected page of a second memory block of the memory device.

A memory system according to another aspect of the present includes a memory device including memory blocks and configured to perform a program operation and a read operation for pages included in the memory blocks; and a memory controller configured to store first data inputted externally and control the memory device to read second data from a selected page of a first memory block of the memory blocks and store the first and second data in a selected page of a second memory block of the memory blocks.

BRIEF DESCRIPTION OF THE DRAWINGS

FIG. 5 is a block diagram illustrating a method of operating the memory system according to yet another exemplary embodiment of this disclosure.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 1:
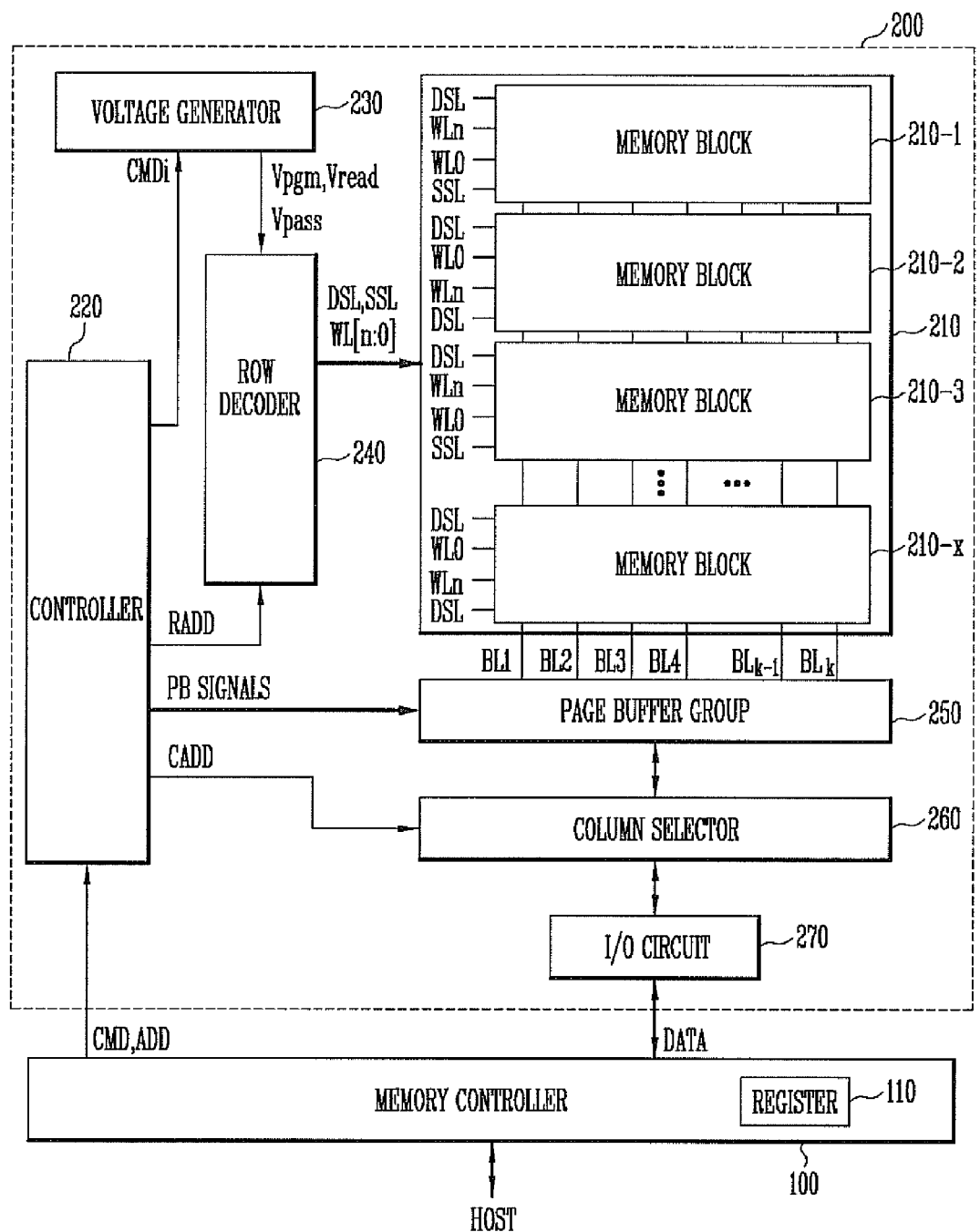
FIG. 1 is a block diagram of a memory system according to an exemplary embodiment of this disclosure.
Figure 2:
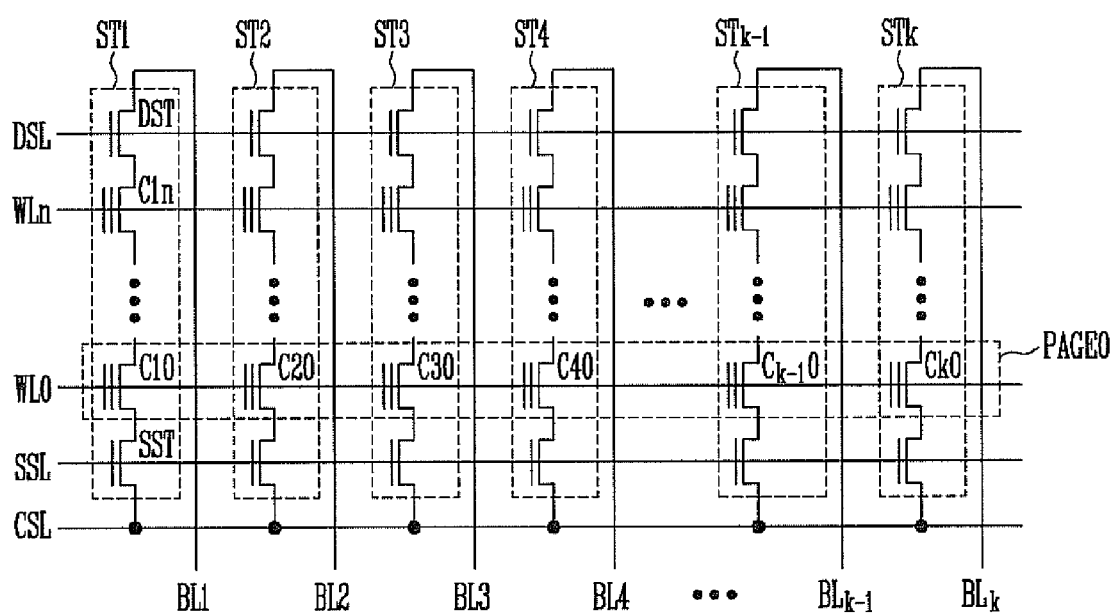
FIG. 2 is a circuit diagram of a memory block shown in FIG. 1.

FIG. 1 is a block diagram of a memory system according to an exemplary embodiment of this disclosure. FIG. 2 is a circuit diagram of a memory block shown in FIG. 1.

Referring to FIGS. 1 and 2, the memory system according to the exemplary embodiment of this disclosure includes a nonvolatile memory device 200 and a memory controller 100 for controlling the nonvolatile memory device 200. The nonvolatile memory device 200 includes a memory cell array 210 including a plurality of memory blocks 210-1 to 210-$x$, an operation circuit group (230, 240, 250, 260, and 270) configured to perform a program operation or a read operation for the memory cells of a memory block (for example, 210-1), and a controller 220 configured to control the operation circuit group (230, 240, 250, 260, and 270). Here, the nonvolatile memory device 200 may be a NAND flash memory device. Further, the operation circuit group may include a voltage supply circuit (230 and 240), a page buffer group 250, a column selector 260, and an I/O circuit 270.

Referring to FIG. 2, each of the memory blocks includes a plurality of strings ST1 to STk coupled between bit lines BL1 to BLk and a common source line CSL. That is, the strings ST1 to STk are coupled to the respective bit lines BL1 to BLk and commonly coupled to the common source line CSL. Each of the strings, e.g., the string ST1, includes a source select transistor SST having a source coupled to the common source line CSL, a plurality of memory cells C10 to C1$n$, and a drain select transistor DST having a drain coupled to the bit line BL1. The gate of the source select transistor SST is coupled to a source select line SSL. The gates of the memory cells C10 to C1$n$ are coupled to respective word lines WL0 to WL$n$. The gate of the drain select transistor DST is coupled to a drain select line DSL.

In a NAND flash memory device, the memory cells of a memory block may be divided/distinguished on the basis of a physical page or a logical page. A page (e.g., an even page and an odd page) is the basic unit of a program operation or a read operation.

For example, the memory cells C10 to Ck0 coupled to one word line WL0 may form one physical page PAGE0. Furthermore, odd-numbered memory cells C10 and C30 to Ck-10 coupled to one word line WL0 may form an odd physical page. Even-numbered memory cells C20 and C40 to Ck0 may form one even physical page.

Referring to FIG. 1, the controller 220 generates an internal command signal CMDi for a program operation, a read operation, or an erase operation in response to a command signal CMD generated by the memory controller 100 and also generates control signals PB SIGNALS for controlling the page buffers of the page buffer group 250 based on a type of the operation. Furthermore, the controller 220 generates a row address signal RADD and a column address signal CADD in response to an address signal ADD.

In the present disclosure, the controller 220 controls the operation circuit group (230, 240, 250, 260, and 270) so that a copyback program operation for storing data, stored in a selected page of one memory block (for example, 210-3), in a selected page of the other memory block (for example, 210-1) can be performed. In particular, the controller 220 controls the operation circuit group (230, 240, 250, 260, and 270) so that both of data received from a host and data stored in a selected page of one memory block (for example, 210-3) can be stored in a selected page of the other memory block (for example, 210-1).

The voltage supply circuit (230 and 240) supplies the drain select line DSL, the word lines WL0 to WLn, and the source select line SSL of a memory block with operating voltages for the program operation or the read operation of memory cells in response to the internal command signal CMDi. The voltage supply circuit includes the voltage generator 230 and the row decoder 240.

The voltage generator 230 outputs operating voltages for the program operation or the read operation of memory cells to global lines in response to the internal command signal CMDi of the controller 220. The voltage generator 230 outputs a program voltage Vpgm or a read voltage Vread to be supplied to selected memory cells and outputs a pass voltage Vpass to be supplied to non-selected memory cells to the global lines, when the program operation or the read operation is performed.

The row decoder 240 transfers the operating voltages of the voltage generator 230 to the local lines DSL, WL0 to WLn, and SSL of the selected memory block 210-1 of the memory cell array 210 in response to the row address signals RADD of the controller 220.

The page buffer group 250 includes a plurality of page buffers (not shown). The page buffers may be coupled to the respective bit lines BL1 to BLk or may be coupled to even bit lines and odd bit lines forming pairs of bit lines, respectively. Each of the page buffers controls voltages of the bit lines BL1 to BLk in order to store data in the cells C10 to Ck0 or read data stored in the cells C10 to Ck0 in response to the control signals PB SIGNALS of the controller 220.

The column selector 260 selects the page buffers of the page buffer group 250 in response to the column address signal CADD of the controller 220. Data to be stored in the memory cells is stored in a page buffer selected by the column selector 260, or data read from the memory cells is outputted from a page buffer selected by the column selector 260.

The I/O circuit 270 transfers data DATA, received from the memory controller 100, to the column selector 260 under the control of the controller 220 in a program operation so that the data DATA is stored in the memory cells via the page buffer group 250. When the column selector 260 sequentially transfers the received data DATA to the page buffers of the page buffer group 250, the page buffers store the data DATA in their latches. Furthermore, in a read operation, the I/O circuit 270 outputs data DATA, received from the page buffers of the page buffer group 250 via the column selector 260, to the memory controller 100.

The memory controller 100 outputs the command signal CMD and the address signal ADD to the nonvolatile memory device 200 at the request of a host HOST and may further output data DATA to the nonvolatile memory device 200 in a program operation. In particular, the memory controller 100 also performs a function of temporarily storing first data received from the outside and second data, stored in one memory block, in a copyback program operation so that both the first external data and the second data can be stored in the other memory block. The memory controller 100 may further include a register 110 for temporarily storing the first external data and the second data.

An operation (that is, a copyback program operation) of storing third data, including first data externally received and second data stored in a selected page of one memory block, in a selected page of the other memory block is described with reference to FIG. 3.

Figure 3:
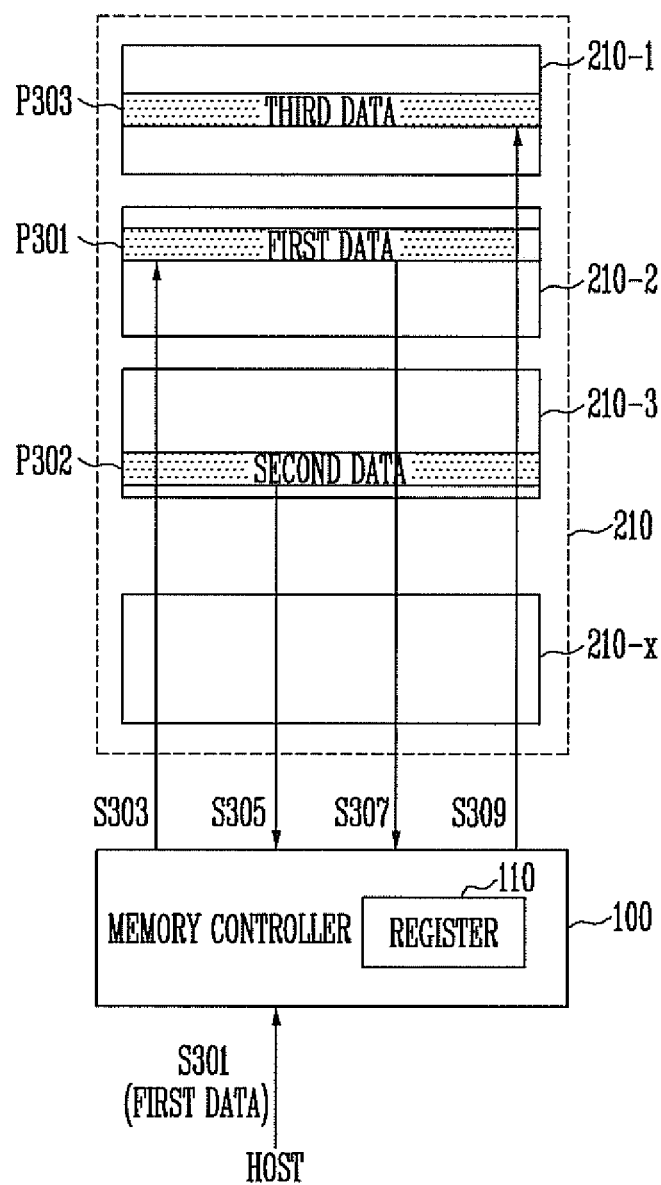
FIG. 3 is a block diagram illustrating a method of operating the memory system according to an exemplary embodiment of this disclosure.

FIG. 3 is a block diagram illustrating a method of operating the memory system according to an exemplary embodiment of this disclosure.

Referring to FIG. 3, the first data is inputted from the outside (for example, the host) to the memory controller 100 at step S301. When the memory controller 100 transfers the first data to the nonvolatile memory device 200, the nonvolatile memory device 200 performs a program operation for storing the first data in a selected page (for example, P301) of the memory block 210-2 at step S303.

For the program operation, the first data is inputted to the page buffer group 250 via the I/O circuit 270 and the column selector 260 and voltages of the bit lines BL1 to BLk are determined based on the first data. Next, when the voltage supply circuit (230 and 240) supplies the program voltage Vpgm and the pass voltage Vpass to the local lines of the memory block 210-2, the first data is stored in the selected page P301 of the memory block 210-2. The memory controller 100 may input a command signal, together with the first data, to the nonvolatile memory device 200 so that the nonvolatile memory device 200 can store the first data in the selected page P301 of the memory block 210-2.

In response to the command signal of the memory controller 100, the nonvolatile memory device 200 transfers the second data, stored in a selected page (for example, P302) of the memory block 210-3, to the memory controller 100 by a read operation at step S305.

For the read operation, when the bit lines BL1 to BLk are precharged and the voltage supply circuit (230 and 240) supplies the read voltage Vread and the pass voltage Vpass to the local lines of the memory block 210-3, voltages of the bit lines BL1 to BLk are shifted based on the second data stored in the selected page P302. The page buffer group 250 latches data corresponding to the voltages of the bit lines BL1 to BLk and outputs the latched data. The outputted data is transferred to the memory controller 100 via the column selector 260 and the I/O circuit 270.

The memory controller 100 temporarily stores the second data, received from the nonvolatile memory device 200, in the register 110. Next, the nonvolatile memory device 200 detects the first data stored in the selected page P301 of the memory block 210-2 using the read operation and transfers the first data to the memory controller 100 at step S307. Likewise, the memory controller 100 temporarily stores the first data, received from the nonvolatile memory device, in the register 110. Accordingly, the third data, including the first data and the second data, is stored in the register 110 of the memory controller 100. Although an example in which the second data is first inputted to the memory controller 100 and the first data is then inputted to the memory controller 100 has been described, the first data may be first inputted to the memory controller 100.

When the memory controller 100 transfers the third data to the nonvolatile memory device 200, the nonvolatile memory device 200 performs the program operation at step S309 as described above in order to store the third data in the selected page P303 of the memory block 210-1.

Meanwhile, since the third data includes the first data and the second data, the data capacity of the third data is the same as a sum of the data capacities of the first and second data. Accordingly, if the first data is read from the even page or the odd page of the physical page P301 and the second data is read from the even page or the odd page of the physical page P302, the first data and the second data included in the third data can be stored in the even page and the odd page of the physical page P303, respectively.

For another embodiment, the first data of the third data may be stored in a least significant bit (hereinafter referred to as an 'LSB') page corresponding to a lower logical page of the physical page P303 by an LSB program operation, and the second data of the third data may be stored in a most significant bit (hereinafter referred to as an 'MSB page') page corresponding to an upper logical page of the physical page P303 by an MSB program operation. In some embodiments, the second data may be stored in the LSB page corresponding to the logical lower page of the physical page P303 by the LSB program operation, and the first data may be stored in the MSB page corresponding to the logical upper page of the physical page P303 by the MSB program operation.

The LSB page and the MSB page are the units for classifying/distinguishing logical pages in a multi-level chip (MLC) program method of storing 2-bit or more data in one memory cell. The LSB page and the MSB page have been widely known in the art, and a detailed description thereof is omitted.

If the copyback program operation is performed as described above, the first data is stored in the selected page P301 of the memory block 210-2 and then read again. In this case, the entire operating time may be long.

Figure 4:
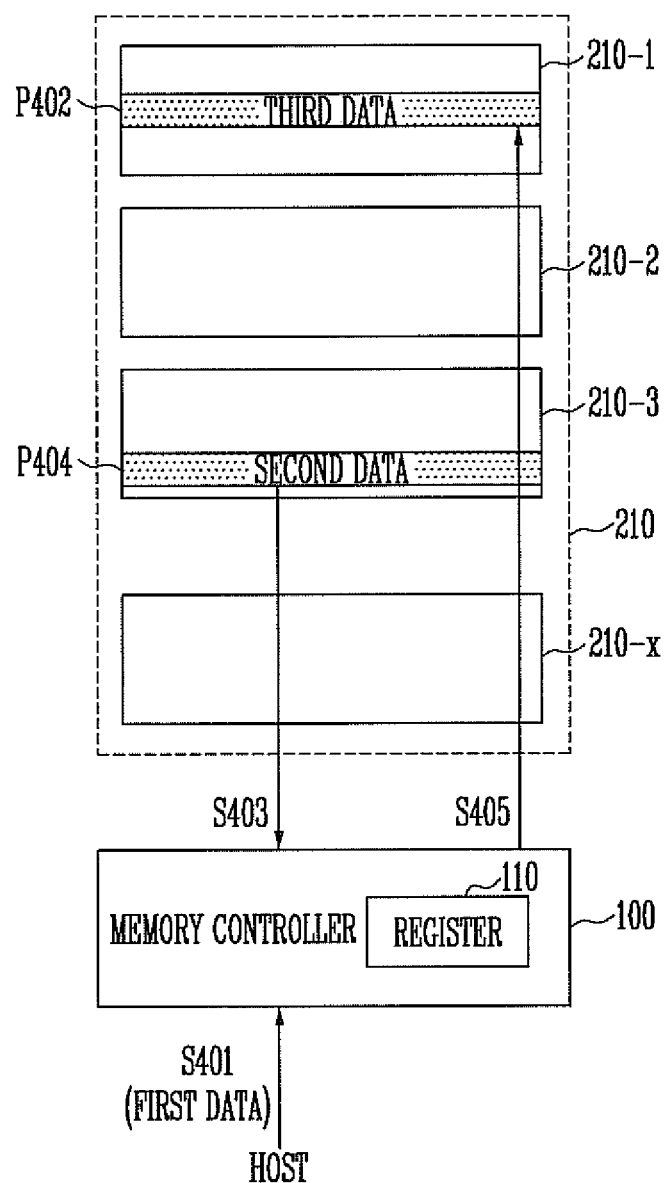
FIG. 4 is a block diagram illustrating a method of operating the memory system according to another exemplary embodiment of this disclosure.

FIG. 4 is a block diagram illustrating a method of operating the memory system according to another exemplary embodiment of this disclosure.

Referring to FIG. 4, the first data is inputted from the outside (for example, the host) to the memory controller 100 at step S401. The memory controller 100 may store the first data in the register 110.

The nonvolatile memory device 200 reads the second data, stored in a selected page (for example, P404) of the memory block 210-3, and transfers the second data to the memory controller 100 using a read operation (S403) in response to the command signal of the memory controller 100.

For the read operation, when the bit lines BL1 to BLk are precharged and the voltage supply circuit (230 and 240) supplies the read voltage Vread and the pass voltage Vpass to the local lines of the memory block 210-3, voltages of the bit lines BL1 to BLk are changed based on the second data stored in the selected page P404. The page buffer group 250 latches data corresponding to the voltages of the bit lines BL1 to BLk and outputs the latched data. The outputted data is transferred to the memory controller 100 through the column selector 260 and the I/O circuit 270.

The memory controller 100 temporarily stores the second data, received from the nonvolatile memory device 200, in the register 110. Accordingly, the third data, including the first data and the second data received from nonvolatile memory device 200, is stored in the register 110 of the memory controller 100.

When the memory controller 100 transfers the third data to the nonvolatile memory device 200, the nonvolatile memory device 200 performs the program operation (S405) as described above in response to the command signal and the third data of the memory controller 100 in order to store the third data in a selected page (for example, P402) of the memory block 210-1.

The first data of the third data may be stored in the even page of the selected page P402, and the second data of the third data may be stored in the odd page of the selected page P402. Accordingly, the data capacity of the third data is the same as a sum of the data capacities of the first and second data.

For another embodiment, the first data of the third data may be stored in an LSB page corresponding to a lower logical page of the physical page P402, and the second data of the third data may be stored in an MSB page corresponding to an upper logical page of the physical page P402.

If the copyback program operation is performed as described above, a program operation for storing the first data in a selected page of a memory block and a read operation for reading the first data stored in a selected page of a memory block can be omitted. Accordingly, in the copyback program operation, a data processing can be simplified and thus the copyback program operation can be performed efficiently and quickly.

FIG. 5 is a block diagram illustrating a method of operating the memory system according to yet another exemplary embodiment of this disclosure.

Referring to FIG. 5, the memory cell array 210 may include at least two planes 210P1 and 210P2. Each of the planes includes the memory blocks shown in FIG. 2.

The first data is inputted from the outside (for example, the host) to the memory controller 100 at step S501. The memory controller 100 may store the first data in the register 110.

The nonvolatile memory device 200 reads the second data, stored in a selected page (for example, P501) of a memory block 210P1-3 of the first plane 210P1, and transfers the second data to the memory controller 100 by performing the read operation (S503) as described above in response to the command signal of the memory controller 100.

The memory controller 100 temporarily storing the second data, received from the nonvolatile memory device 200, in the register 110. Accordingly, the third data, including the first data externally received and the second data read from the selected page P501, is stored in the register 110 of the memory controller 100.

When the memory controller 100 transfers the third data to the nonvolatile memory device 200, the nonvolatile memory device 200 performs the program operation (S505) as described above in response to the command signal and the third data in order to store the third data in a selected page (for example, P502) of a memory block 210P2-1 of the second plane 210P2.

If the copyback program operation is performed as described above, a data processing can be simplified and a copyback program operation for storing data, stored in the memory block of one plane, in the memory block of the other plane can be performed.

As described above, in a copyback program operation for storing external data and data, stored in one memory device, in the other memory device, a data processing can be simplified and thus the copyback program operation can be performed efficiently and quickly.

What is claimed is:
1. A method of operating a memory system, comprising:
receiving first data to be stored in a memory device from an outside of the memory system, wherein a capacity of the first data is half of a capacity of a page;
temporarily storing the first data in a memory controller without programming of the first data to the memory device;
storing second data in the memory controller, wherein the second data is read from an even page or an odd page in a selected page of a first memory block of the memory device, wherein a capacity of the second data is half of the capacity of the page; and
performing a program operation for storing third data including the first data and the second data in a selected pane of a third memory block,
wherein the first data is programmed to the even page when the second data is programmed to the odd page, or the first data is programmed to the odd page when the sec- ond data is programmed to the even page, and a capacity of the third data is two times greater than the capacity of the first data and the capacity of the second data.

2. The method of claim 1, wherein: the first data stored in the memory controller is stored in a least significant bit (LSB) page of the selected page of the second memory block by an LSB program operation of the program operation, and the second data stored in the memory controller is stored in a most significant bit (MSB) page of the selected page of the second memory block by an MSB program operation of the program operation.

3. The method of claim 1, wherein: the second data stored in the memory controller is stored in a least significant bit (LSB) page of the selected page of the second memory block by an LSB program operation of the program operation, and the first data stored in the memory controller is stored in a most significant bit (MSB) page of the selected page of the second memory block by an MSB program operation of the program operation.

4. The method of claim 1, wherein the first memory block is included in a first plane of the memory device, and the second memory block is included in a second plane of the memory device.

5. A memory system, comprising:
  a memory device comprising a plurality of memory blocks and configured to perform a program operation and a read operation for pages included in the memory blocks; and
  a memory controller configured to receive first data to be stored in the memory device from an outside of the memory system and temporarily store the first data without programming the first data to the memory device, wherein a capacity of the first data is half of a capacity of a page,
  wherein the memory controller stores second data read from an even page or an odd page to a selected page of a first memory block of the memory device by the read operation, wherein a capacity of the second data is half of the capacity of the page, and control the memory device to store third data including the first data and the second data to a selected page of a second memory block of the memory device, wherein a capacity of the third data is two times greater than the capacity of the first data and the capacity of the second data,
  wherein the memory controller controls the memory device to store the first data in an even page of the selected page when the second data is programmed to an odd page of the selected page, or store the first data in the odd page of the selected page when the second data is programmed to the even page of the selected page.

6. The memory system of claim 5, wherein the memory device is configured to perform a least significant bit (LSB) program operation for storing the first data in an LSB page of the selected page of the second memory block and a most significant bit (MSB) program operation for storing the second data in an MSB page of the selected page of the second memory block under the control of the memory controller.

7. The memory system of claim 5, wherein the memory device is configured to perform a least significant bit (LSB) program operation for storing the second data in an LSB page of the selected page of the second memory block and a most significant bit (MSB) program operation for storing the first data in an MSB page of the selected page of the second memory block under the control of the memory controller.

8. The memory system of claim 5, wherein: the memory device comprises a first plane including one of the memory blocks and a second plane including another of the memory blocks, wherein the first memory block is included in the first plane and the second memory block is included in the second plane.

9. The memory system of claim 5, wherein the memory controller further comprises a register for storing the first data and the second data.

10. The memory system of claim 5, wherein when the first data is inputted, the memory controller is configured to transfer the first data and the second data to the memory device after the second data is read from the memory device.

11. A method of operating a memory system, comprising:
  receiving first data to be stored in a memory device from an outside of the memory system, wherein a capacity of the first data is half of a capacity of a page;
  temporarily storing the first data to a memory controller without programming the first data to the memory device;
  storing second data in the memory controller, wherein the second data is read from a first page of a first memory block of a first plane of the memory device, wherein a capacity of the second data is half of the capacity of the page; and
  performing a program operation for storing third data including the first data and the second data to a second page of a second memory block of a second plane of the memory device,
  wherein before the program operation for storing the first data and the second data, the first data is not stored in the memory device and the second data is stored in the memory device.

* * * * *